US009685470B2

(12) United States Patent
Hao

(10) Patent No.: US 9,685,470 B2
(45) Date of Patent: Jun. 20, 2017

(54) MANUFACTURING METHOD OF A PIXEL STRUCTURE

(71) Applicant: Shenzhen China Star Optoelectronics Technology Co., Ltd., Shenzhen, Guangdong (CN)

(72) Inventor: Sikun Hao, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 183 days.

(21) Appl. No.: 14/349,281

(22) PCT Filed: Nov. 18, 2013

(86) PCT No.: PCT/CN2013/087347
§ 371 (c)(1),
(2) Date: Apr. 2, 2014

(87) PCT Pub. No.: WO2015/070461
PCT Pub. Date: May 21, 2015

(65) Prior Publication Data
US 2016/0013219 A1 Jan. 14, 2016

(30) Foreign Application Priority Data
Nov. 12, 2013 (CN) .......................... 2013 1 0562065

(51) Int. Cl.
H01L 27/12 (2006.01)
G02F 1/1343 (2006.01)

(52) U.S. Cl.
CPC .... H01L 27/1255 (2013.01); G02F 1/134309 (2013.01); H01L 27/124 (2013.01);
(Continued)

(58) Field of Classification Search
CPC ............. H01L 27/1214; H01L 29/4908; H01L 29/66765; H01L 29/66757; H01L 33/08;
(Continued)

(56) References Cited

U.S. PATENT DOCUMENTS

2007/0024791 A1* 2/2007 Nishida ............. G02F 1/134363
349/141
2012/0038874 A1* 2/2012 Kim ........................ H01L 27/12
349/138

FOREIGN PATENT DOCUMENTS

CN 1904680 A 1/2007
CN 101442056 A 5/2009
(Continued)

OTHER PUBLICATIONS

Deposit. (n.d.) American Heritage® Dictionary of the English Language. Retrieved Sep. 29, 2016 from https://ahdictionary.com/word/search.html?q=deposit&submit.x=71&submit.y=30.*

Primary Examiner — Caridad Everhart
Assistant Examiner — Mikka Liu
(74) Attorney, Agent, or Firm — Andrew C. Cheng

(57) ABSTRACT

The present invention provides a pixel structure and a manufacturing method thereof. The pixel structure includes: a transparent substrate (60), a gate line formed on the transparent substrate (60), a thin-film transistor formed on the transparent substrate (60), a data line (68) formed on the transparent substrate (60), a pixel electrode (62) formed on the transparent substrate (60) and the thin-film transistor, a passivation layer (64) formed on the pixel electrode (62), the transparent substrate (60), and the data line (68), and a common electrode (66) formed on the passivation layer (64). The passivation layer (64) includes: a first portion (72) located on the data line (68), a second portion (74) located on the pixel electrode (62), and a third portion (76) located on the transparent substrate (60) and arranged on two
(Continued)

opposite sides of the data line (68). The first portion (72) of the passivation layer (64) has a thickness greater than a thickness of the second portion (74).

2 Claims, 6 Drawing Sheets

(52) U.S. Cl.
CPC ............... *H01L 27/1262* (2013.01); *G02F 2001/134372* (2013.01)

(58) Field of Classification Search
CPC . H01L 23/3171; H01L 51/107; H01L 51/448; G02F 1/136227; G02F 1/134363; G02F 2001/133357; G02F 1/1333
See application file for complete search history.

(56) References Cited

FOREIGN PATENT DOCUMENTS

| | | |
|---|---|---|
| CN | 101764091 A | 6/2010 |
| CN | 102375277 A | 3/2012 |
| JP | 2007017829 A | 1/2007 |

* cited by examiner

MANUFACTURING METHOD OF A PIXEL STRUCTURE

BACKGROUND OF THE INVENTION

1. Field of the Invention

The present invention relates to the field of displaying technology, and in particular to a pixel structure and a manufacturing method thereof.

2. The Related Arts

The displaying technology has undergone rapid progress recently. A flat display device applies totally different techniques of displaying and manufacturing, making it significantly differing from the conventional video image displaying devices. The conventional video image displaying device is generally based on a cathode ray tube (CRT), from which a flat display device is made different primarily concerning changes made in respect of weight and size (thickness). Generally, a flat display device has a thickness not greater than 10 centimeters, among the other differences associated with various technical aspects, such as theory of displaying, manufacturing material, manufacturing process, driving for displaying video images.

A liquid crystal display (LCD) is one of the flat display devices that are most commonly used and comprise a color screen of high PPI (pixels per inch) and is widely used in various electronic equipment, such as a mobile phone, a personal digital assistant (PDA), a digital camera, a computer monitor, and a notebook computer screen.

A currently available liquid crystal display is generally composed of upper and lower substrates and a central liquid crystal layer and the substrates are each composed of a piece of glass and electrodes. If the upper and lower substrates are both provided with electrodes, then a liquid crystal display of a longitudinal electrical field mode can be provided, such as a TN (Twist Nematic) LCD, a VA (Vertical Alignment) LCD, and MVA (Multi-domain Vertical Alignment) LCD that is developed for addressing the issue of narrow viewing angle. Another category is different from the above described LCDs and comprises electrodes that are provided only on one side of the substrates so as to form an LCD of a lateral electrical field mode, such as an IPS (In-Plane Switching) LCD and an FFS (Fringe Field Switching) LCD. The FFS LCDs are widely used in various mobile communication devices due to high aperture ratio, high PPI, and wide viewing angle.

Currently, the display screens of the mobile communication devices are developed toward high PPI, high gamut value, high contrast, and low power consumption. With the increase of PPI, parasitic capacitance inside the screen becomes severer. To reduce the parasitic capacitance of the screen, a common practice is to increase the thickness of an insulation layer that is present between electrodes and made of silicon nitrides (SiNx) or silicon dioxide (SiO$_2$) or to adopt an organic insulation layer that has an even greater thickness. Such practices may also lead to the reduction of beneficial capacitances, such as storage capacitor $C_{st}$, while reducing the harmful parasitic capacitance.

Specifically, reference is now made to FIGS. 1 and 2, wherein FIG. 1 shows the structure of a conventional pixel used in a mobile phone screen and FIG. 2 is a cross-sectional view taken along line A-A of FIG. 1. To simplify the illustration, the structure a TFT (Thin-Film Transistor) related part is omitted in both FIGS. 1 and 2. In such a pixel structure for an FFS LCD, a parasitic capacitance designated with circled 1 between a transparent conductive layer electrode 100 of a common electrode and a data line 200 will increase RC delay of the data line 200 (namely signal transmission speed in the data line being affected by the multiplication of resistance (R) and capacitance (C)). This would cause insufficient charging of some pixels of a liquid crystal panel thereby displaying incorrect gray level and affecting displaying quality. To reduce the parasitic capacitance designated by the circled 1, it is common to increase the thickness of an insulation layer between the transparent conductive layer electrode 100 of the common electrode and the data line 200. However, this also reduces the storage capacitance, designated by circled 2, between the transparent conductive layer electrode 100 of the common electrode and a transparent conductive layer electrode 30 of a pixel electrode. According to the formula, $\Delta V = [C_{gs}/(C_{gs}+C_{st}+C_{lc})](V_{gh}-V_{gt})$ (where $C_{lc}$ is the capacitance generated by a liquid crystal box, $C_{st}$ is the storage capacitance, $C_{gs}$ is the value of coupling capacitance between a gate terminal and a drain terminal of a thin-film transistor, $V_{gh}-V_{gt}$ is voltage change on the gate terminal), the reduction of the storage capacitance, designated by circled 2, will increase the feed-through voltage, lowering down the brightness of the liquid crystal panel and reducing penetration.

Referring to FIG. 3, which illustrates a flow chart of the manufacture of a conventional pixel structure of an FFS liquid crystal display, the first method is: sequentially depositing a first metal layer (GE), a gate insulation (GI) layer, an amorphous silicon (a-Si) layer, a pixel electrode (Pixel ITO), a second metal layer (S/D), a passivation (PV) layer, and a common electrode (Com. ITO) on a glass substrate. The second method is: sequentially depositing a first metal layer (GE), a gate insulation (GI) layer, an amorphous silicon (a-Si) layer, a second metal layer (S/D), a pixel electrode (Pixel ITO), a passivation (PV) layer, and a common electrode (Com. ITO) on a glass substrate.

SUMMARY OF THE INVENTION

Thus, an object of the present invention is to provide a pixel structure, which decreases the distance between a pixel electrode and a common electrode to increase the storage capacitance of the pixel structure, so as to reduce the influence of a feed-through voltage and electrical leakage on displaying quality of an FFS LCD using such a pixel structure.

Another object of the present invention is to provide a manufacturing method of a pixel structure, which manufacturing method is simple and applies a second time etching to increase the storage capacitance of the pixel structure so as to reduce the influence of a feed-through voltage and electrical leakage on displaying quality of an FFS LCD using such a pixel structure.

A further object of the present invention is to provide a manufacturing method of a pixel structure, which manufacturing method is simple and provides a passivation layer of a two-layered structure to increase the storage capacitance of the pixel structure so as to reduce the influence of a feed-through voltage and electrical leakage on displaying quality of an FFS LCD using such a pixel structure.

To achieve the objects, the present invention provides a pixel structure, which comprises: a transparent substrate, a gate line formed on the transparent substrate, a thin-film transistor formed on the transparent substrate, a data line formed on the transparent substrate, a pixel electrode formed on the transparent substrate and the thin-film transistor, a passivation layer formed on the pixel electrode, the transparent substrate, and the data line, and a common electrode formed on the passivation layer. The passivation layer comprises: a first portion located on the data line, a second portion located on the pixel electrode, and a third portion that is located on the transparent substrate and arranged on two opposite sides of the data line. The first portion of the passivation layer has a thickness that is greater than a thickness of the second portion. The pixel electrode and the common electrode partly overlap so as to form a storage capacitance.

The thickness of the first portion of the passivation layer is greater than a thickness of the third portion and a top of the second portion of the passivation layer is substantially flush with a top of the third portion. The pixel structure further comprises a protective layer formed between the thin-film transistor and the pixel electrode.

The thin-film transistor comprises a gate terminal, a drain terminal, and a source terminal. The gate terminal is electrically connected to the gate line; the source terminal is electrically connected to the data line; and the drain terminal is electrically connected to the pixel electrode. The pixel electrode is a transparent conductive layer. The common electrode is a transparent conductive layer.

The present invention also provides a manufacturing method of a pixel structure, which comprises the following steps:

(11) providing a transparent substrate;

(12) depositing a gate line, a thin-film transistor, a data line, and a pixel electrode on the transparent substrate;

(13) depositing a passivation layer on the transparent substrate, the data line, and the pixel electrode, wherein the passivation layer comprises: a first portion located on the data line, a second portion located on the pixel electrode, and a third portion located on the transparent substrate and arranged on two opposite sides of the data line;

(14) applying etching to a portion of the passivation layer on a peripheral circuit so as to complete a first time etching and then subjecting the second portion of the passivation layer to etching so as to complete a second time etching to reduce a thickness of the second portion of the passivation layer thereby making a thickness of the first portion of the passivation layer greater than the thickness of the second portion; and

(15) depositing a common electrode on the passivation layer.

Step (12) further comprises forming a protective layer on the transparent substrate so that the protective layer is arranged between the thin-film transistor and the pixel electrode.

The second time etching of step (14) further comprises etching applied to the third portion of the passivation layer so that after the completion of the second time etching, the thickness of the first portion of the passivation layer is greater than the thickness of the third portion and a top of the second portion of the passivation layer is substantially flush with a top of the third portion.

The pixel electrode is a transparent conductive layer and the common electrode is a transparent conductive layer.

The present invention further provides a manufacturing method of a pixel structure, which comprises the following steps:

(21) providing a transparent substrate;

(22) depositing a gate line, a thin-film transistor, a data line, and a pixel electrode on the transparent substrate;

(23) depositing a first passivation layer on the transparent substrate, the data line, and the pixel electrode and subjecting the first passivation layer to etching in such a way that only a portion of the first passivation layer that is located on the data line is preserved, while a remaining portion is removed;

(24) depositing a second passivation layer on the transparent substrate, the pixel electrode, and the first passivation layer and subjecting the second passivation layer to etching in such a way that a portion of the second passivation layer on a peripheral circuit is removed, while a remaining portion is preserved; and

(25) depositing a common electrode on the second passivation layer.

The first passivation layer has a thickness greater than a thickness of the second passivation layer.

Step (22) further comprises forming a protective layer on the transparent substrate so that the protective layer is arranged between the thin-film transistor and the pixel electrode, the pixel electrode being a transparent conductive layer, the common electrode being a transparent conductive layer.

The efficacy of the present invention is that the present invention provides a pixel structure and a manufacturing method thereof, wherein a second time etching operation or a two-layered structure of passivation layer is adopted to reduce the distance between a common electrode and a pixel electrode so as to increase storage capacitance of the pixel structure and at the same time, the distance between a data line and the common electrode is increased to reduce harmful parasitic capacitance so as to reduce the influence of a feed-through voltage and electrical leakage on displaying quality of an FFS liquid crystal display that uses the pixel structure. Further, the manufacturing method of the pixel structure is relatively simple.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
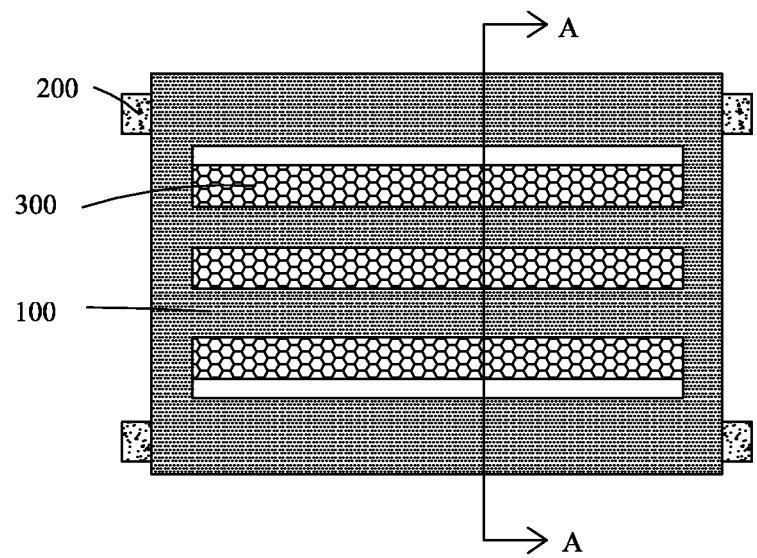
FIG. 1 is a schematic view showing the structure of a conventional pixel.
Figure 2:
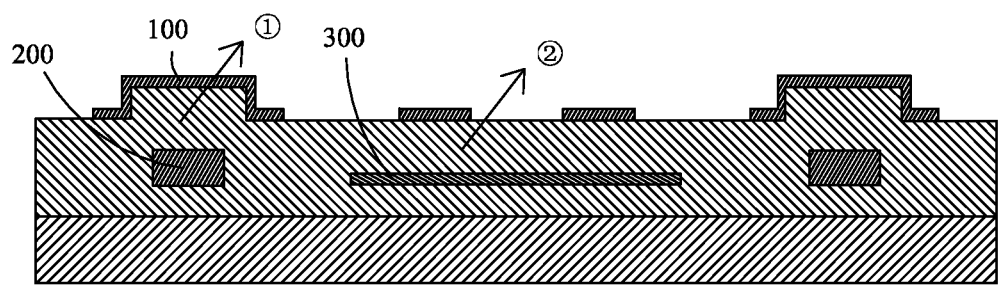
FIG. 2 is a cross-sectional view taken along line A-A of FIG. 1.
Figure 3:
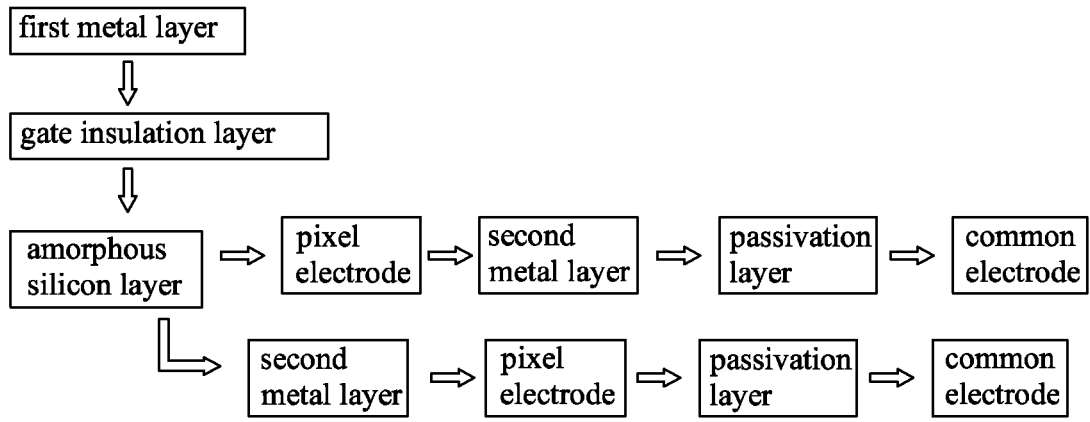
FIG. 3 is a flow chart illustrating a manufacturing process of a conventional pixel structure.
Figure 4:
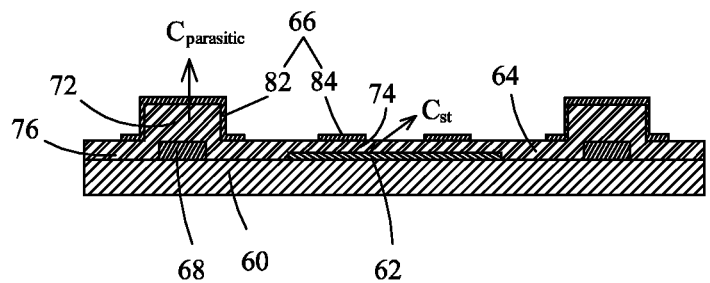
FIG. 4 is a schematic view showing a pixel structure according to the present invention.

Referring to FIG. 4, the present invention provides a pixel structure, which comprises:

a transparent substrate 60, a gate line (not shown for the purposes of easy observation) formed on the transparent substrate 60, a thin-film transistor (not shown for the purposes of easy observation) formed on the transparent substrate 60, a data line 68 formed on the transparent substrate 60, a pixel electrode 62 formed on the transparent substrate 60 and the thin-film transistor, a passivation layer 64 formed on the pixel electrode 62, the transparent substrate 60, and the data line 68, and a common electrode 66 formed on the passivation layer 64.

The passivation layer 64 comprises: a first portion 72 located on the data line 68, a second portion 74 located on the pixel electrode 62, and a third portion 76 that is located on the transparent substrate 60 and arranged on two opposite sides of the data line 68. The first portion 72 of the passivation layer 64 has a thickness that is greater than a thickness of the second portion 74. The pixel electrode 62 and the common electrode 66 partly overlap so as to form a storage capacitance $C_{st}$. The present invention increases the distance between the data line 68 and the common electrode 66 to reduce parasitic capacitance $C_{parasitic}$ and at the same time reduces the distance between the pixel electrode 62 and the common electrode 66 to increase the storage capacitance $C_{st}$ so as to reduce the influence of a feed-through voltage and electrical leakage on the displaying quality of an FFS liquid crystal display that uses the pixel structure.

The transparent substrate is a glass substrate. The pixel structure further comprises a protective layer (not shown) formed between the thin-film transistor and the pixel electrode 62.

The thickness of the first portion 72 of the passivation layer 64 is also greater than a thickness of the third portion 76. Preferably, the second portion 74 of the passivation layer 64 has a top that is substantially flush with a top of the third portion 76.

The thin-film transistor functions to respond to a scanning signal of the gate line to apply a data signal of the data line 68 to the storage capacitance $C_{st}$ formed by partly overlapping between the pixel electrode 62 and the common electrode 66 and comprises a gate terminal, a drain terminal, and a source terminal. The gate terminal is electrically connected to the gate line. The source terminal is electrically connected to the data line 68. The drain terminal is electrically connected to the pixel electrode 62.

The common electrode 66 comprises a part 82 that is located on the data line 68 and another part 84 located on the pixel electrode 62. In the instant embodiment, the pixel electrode 62 is a transparent conductive layer and the common electrode 66 is also a transparent conductive layer.

Figure 5:
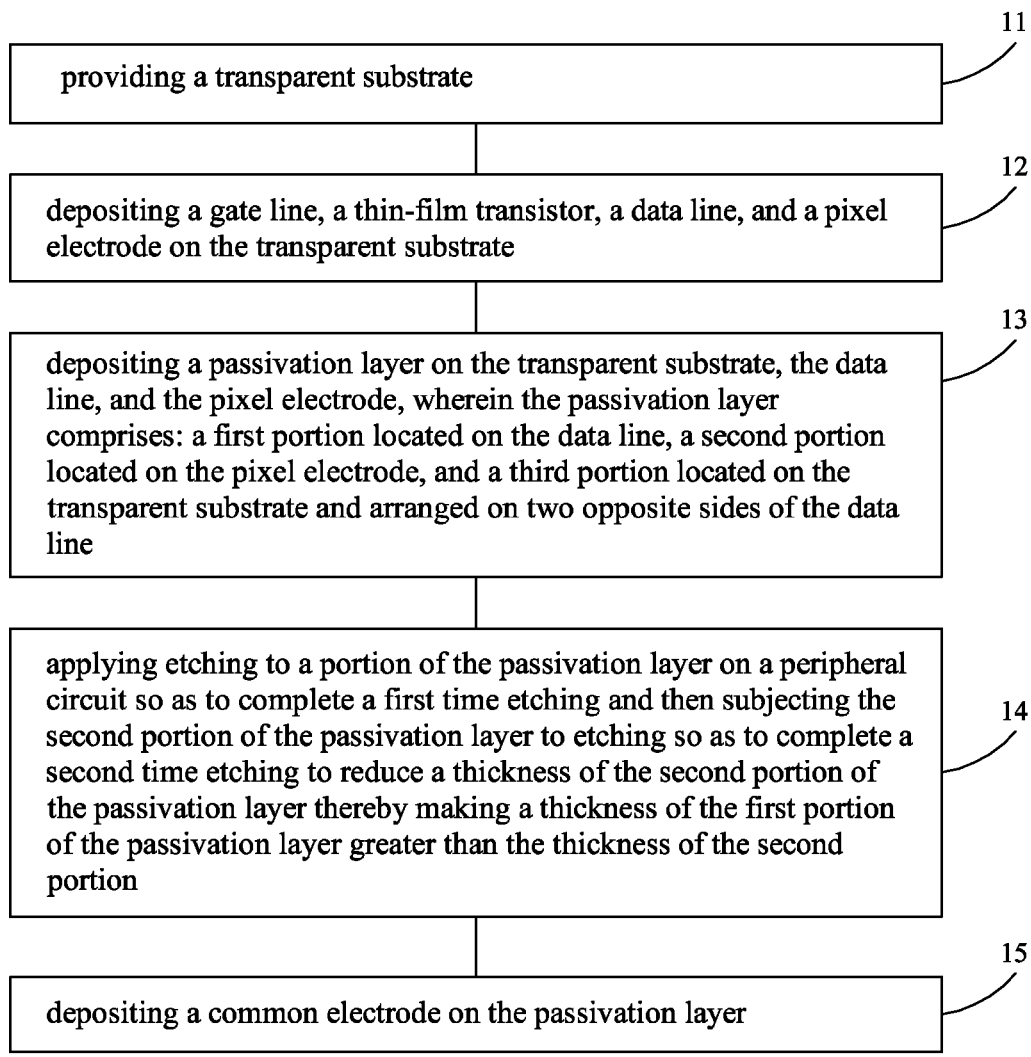
FIG. 5 is a flow chart illustrating a manufacturing method of a pixel structure according to an embodiment of the present invention.
Figure 6:
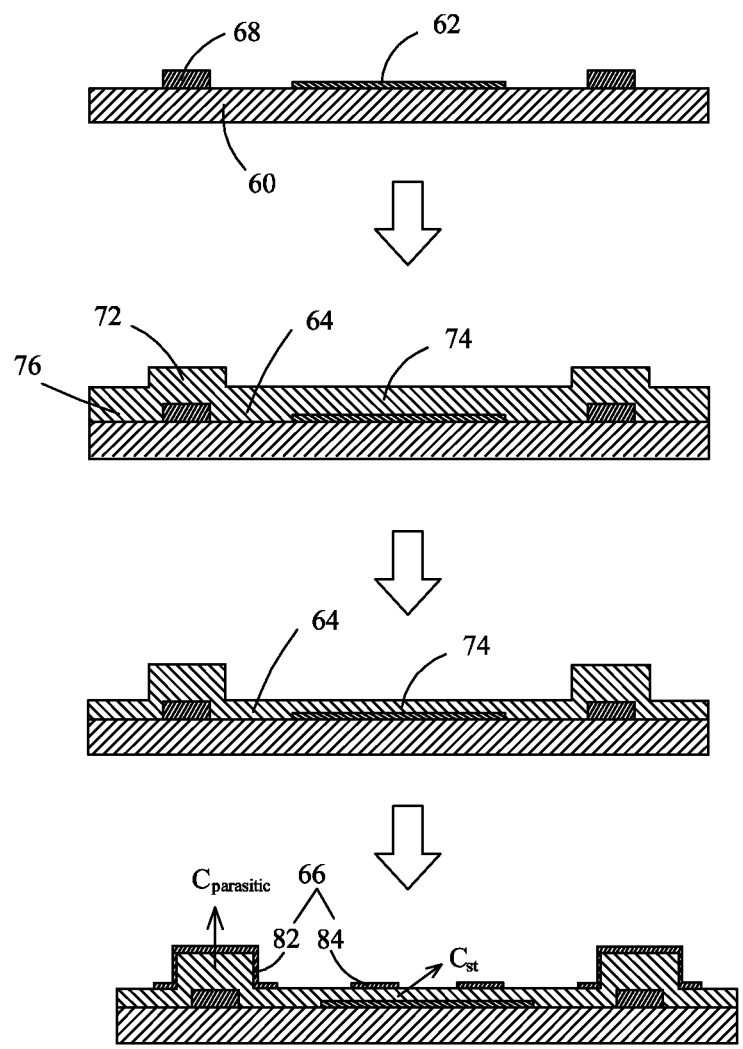
FIG. 6 schematically shows the structure at various steps of the manufacturing method of FIG. 5.

Referring to FIGS. 4-6, the present invention also provides a manufacturing method of a pixel structure, which comprises the following steps:

Step 11: providing a transparent substrate 60.

The transparent substrate 60 is a glass substrate.

Step 12: depositing a gate line, a thin-film transistor, a data line 68, and a pixel electrode 62 on the transparent substrate 60.

The processes used to form the gate line, the thin-film transistor, the data line 68, and the pixel electrode 62 can be any known operations.

The step further comprises forming a protective layer on the transparent substrate 60 so that the protective layer is arranged between the thin-film transistor and the pixel electrode 62. The process used to form the protective layer can identical to any known operation.

The thin-film transistor comprises a gate terminal, a drain terminal and a source terminal. The gate terminal is electrically connected to the gate line. The source terminal is electrically connected to the data line 68. The drain terminal of the thin-film transistor is electrically connected to the pixel electrode 62 is order apply a data signal of the data line 68 to the storage capacitance $C_{st}$. The pixel electrode 62 is a transparent conductive layer.

Step 13: depositing a passivation layer 64 on the transparent substrate 60, wherein the passivation layer 64 comprises: a first portion 72 located on the data line 68, a second portion 74 located on the pixel electrode 62, and a third portion 76 located on the transparent substrate 60 and arranged on two opposite sides of the data line 68.

Step 14: applying etching to a portion of the passivation layer 64 on a peripheral circuit so as to complete a first time etching and then subjecting the second portion 74 of the passivation layer 64 to etching so as to complete a second time etching to reduce a thickness of the second portion 74 of the passivation layer 64 thereby making a thickness of the first portion 72 of the passivation layer 64 greater than the thickness of the second portion 74.

The second time etching of Step 14 further comprises etching applied to the third portion 76 of the passivation layer 64 so that after the completion of the second time etching, the thickness of the first portion 72 of the passivation layer 64 is greater than the thickness of the third portion 76. Preferably, a top of the second portion 74 of the passivation layer 64 is substantially flush with a top of the third portion 76.

Step 15: depositing a common electrode 66 on the passivation layer 64.

The common electrode 66 is a transparent conductive layer, which comprises a part 82 that is located on the data line 68 and another part 84 located on the pixel electrode 62. In the present invention, the thickness of the first portion 72 of the passivation layer 64 is greater than the thickness of the second portion 74. In other words, while the distance between the data line 68 and the common electrode 66 is enlarged to decrease the parasitic capacitance $C_{parasitic}$, the distance between the pixel electrode 62 and the common electrode 66 is reduced to increase the storage capacitance $C_{st}$, in order to reduce the influence of a feed-through voltage and electrical leakage on displaying quality of an FFS liquid crystal display using the pixel structure.

Figure 7:
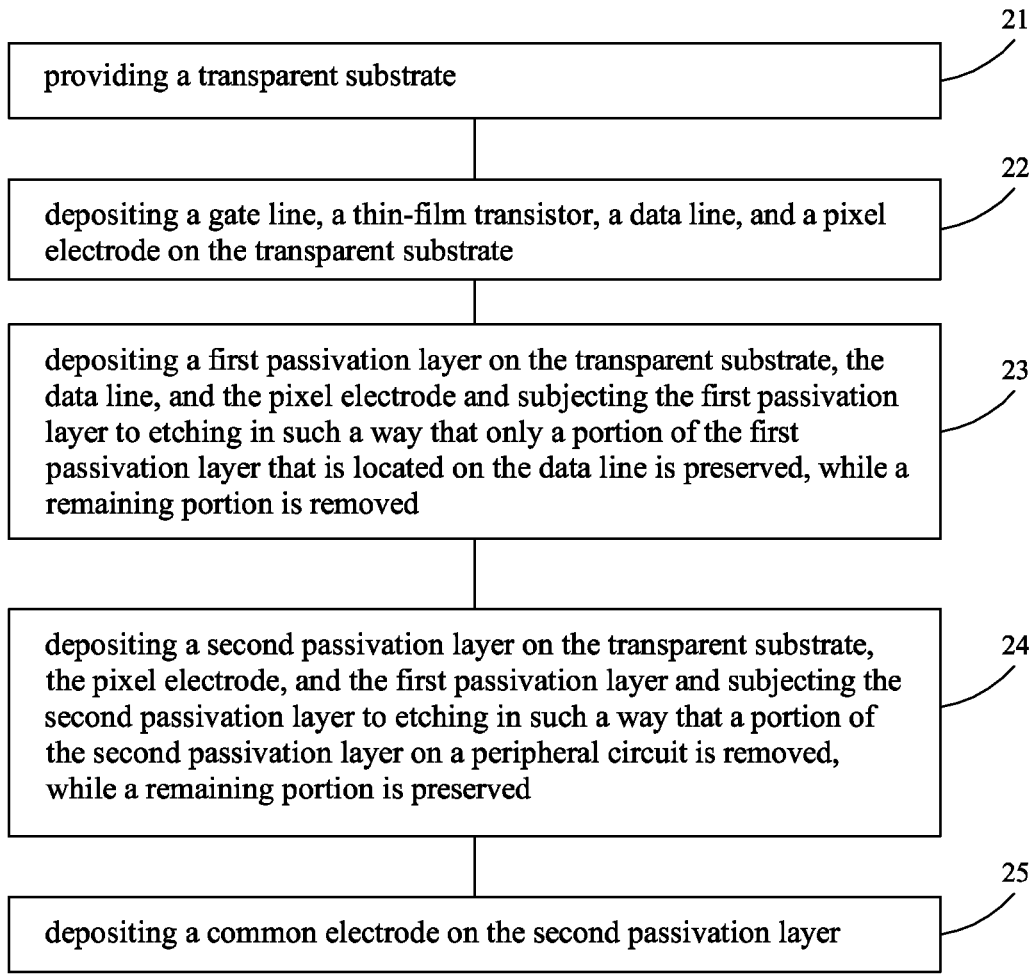
FIG. 7 is a flow chart illustrating a manufacturing method of a pixel structure according to another embodiment of the present invention.
Figure 8:
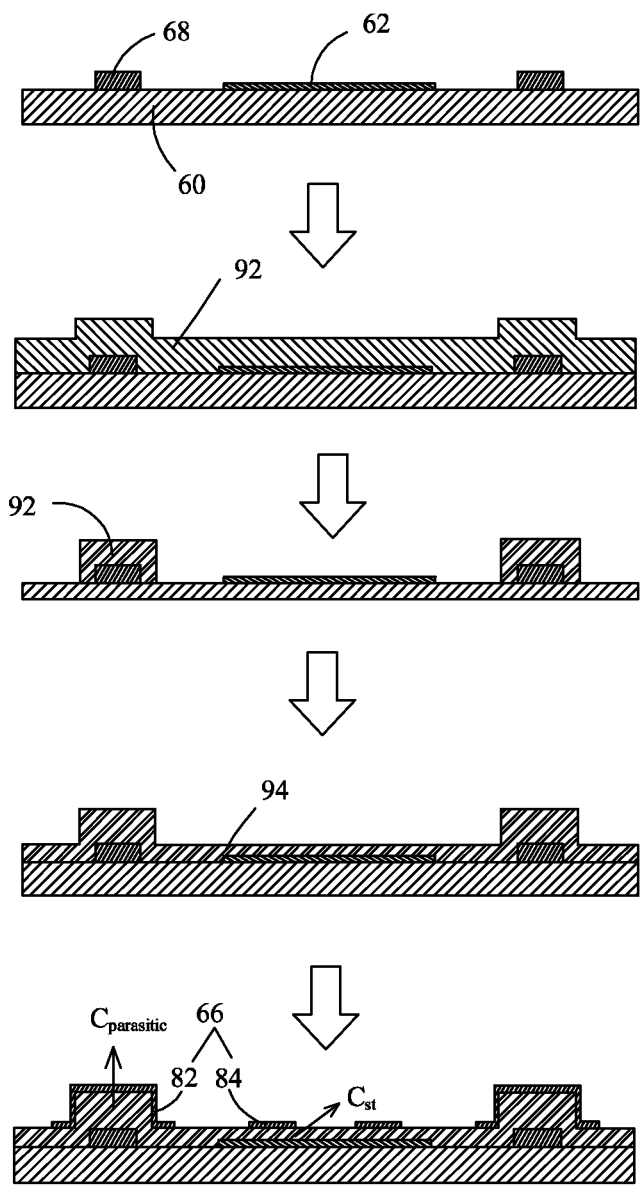
FIG. 8 schematically shows the structure at various steps of the manufacturing method of FIG. 7.

Referring to FIGS. 7 and 8, with simultaneous reference to FIG. 4, the present invention further provides a manufacturing method of a pixel structure, which comprises the following steps:

Step 21: providing a transparent substrate 60.

The transparent substrate 60 is a glass substrate.

Step 22: depositing a gate line, a thin-film transistor, a data line 68, and a pixel electrode 62 on the transparent substrate 60.

The processes used to form the gate line, the thin-film transistor, the data line 68, and the pixel electrode 62 can be any known operations.

The step further comprises forming a protective layer on the transparent substrate 60 so that the protective layer is arranged between the thin-film transistor and the pixel electrode 62. The process used to form the protective layer can identical to any known operation.

The thin-film transistor comprises a gate terminal, a drain terminal and a source terminal. The gate terminal is electrically connected to the gate line. The source terminal is electrically connected to the data line 68. The drain terminal of the thin-film transistor is electrically connected to the pixel electrode 62 is order apply a data signal of the data line 68 to the storage capacitance $C_{st}$.

The pixel electrode 62 is a transparent conductive layer.

Step 23: depositing a first passivation layer 92 on the transparent substrate 60, the data line 68, and the pixel electrode 62 and subjecting the first passivation layer 92 to etching in such a way that only a portion of the first passivation layer 92 that is located on the data line 68 is preserved, while a remaining portion is removed.

Step 24: depositing a second passivation layer 94 on the transparent substrate 60, the pixel electrode 62, and the first passivation layer 92 and subjecting the second passivation layer 94 to etching in such a way that a portion of the second passivation layer 94 on a peripheral circuit is removed, while a remaining portion is preserved.

In the instant embodiment, the first passivation layer 92 has a thickness greater than a thickness of the second passivation layer 94.

Step 25: depositing a common electrode 66 on the second passivation layer 94.

The common electrode 66 is a transparent conductive layer, which comprises a part 82 that is located on the data line 68 and another part 84 located on the pixel electrode 62.

Arranged between the data line 68 and the common electrode 66 comprises the first and second passivation layers 92, 94, while only the second passivation layer 94 is located between the pixel electrode 62 and the common electrode 66 so that the distance between the data line 68 and the common electrode 66 is greater than the distance between the pixel electrode 62 and the common electrode 66, whereby while the distance between the data line 68 and the common electrode 66 is enlarged to decrease the parasitic capacitance $C_{parasitic}$, the distance between the pixel electrode 62 and the common electrode 66 is reduced to increase the storage capacitance $C_{st}$, in order to reduce the influence of a feed-through voltage and electrical leakage on displaying quality of an FFS liquid crystal display using the pixel structure.

In summary, the present invention provides a pixel structure and a manufacturing method thereof, wherein a second time etching operation or a two-layered structure of passivation layer is adopted to reduce the distance between a common electrode and a pixel electrode so as to increase storage capacitance of the pixel structure and at the same time, the distance between a data line and the common electrode is increased to reduce harmful parasitic capacitance so as to reduce the influence of a feed-through voltage and electrical leakage on displaying quality of an FFS liquid crystal display that uses the pixel structure. Further, the manufacturing method of the pixel structure is relatively simple.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A manufacturing method of a pixel structure, comprising the following steps:

providing a transparent substrate;

depositing a data line and a pixel electrode on the transparent substrate;

depositing a passivation layer on the transparent substrate, the data line, and the pixel electrode, wherein the passivation layer comprises: a first portion located on the data line, a second portion located on the pixel electrode, and a third portion located on the transparent substrate and arranged on two opposite sides of the data line, a part of the third portion being located between and connecting between the first portion and the second portion;

subjecting the passivation layer to etching to reduce a thickness of the second portion of the passivation layer such that a thickness of the first portion of the passivation layer is greater than a thickness of the second portion and also, the thickness of the first portion of the passivation layer is greater than a thickness of the third portion and a top of the second portion of the passivation layer is flush with a top of the part of the third portion connecting between the first portion and the second portion, wherein the top of the second portion and the top of the part of the third portion collectively define a flat surface extending continuously to an edge of the first portion; and depositing a common electrode on the passivation layer such that a portion of the common electrode that corresponds to a portion of the pixel electrode is laid flat directly on the flat surface defined collectively by the top of the second portion and the top of the part of the third portion.

2. The manufacturing method of the pixel structure as claimed in claim 1, wherein the pixel electrode is a transparent conductive layer and the common electrode is a transparent conductive layer.

* * * * *